(12) United States Patent
Wang et al.

(10) Patent No.: US 10,727,297 B2
(45) Date of Patent: Jul. 28, 2020

(54) COMPLIMENTARY METAL-OXIDE-SEMICONDUCTOR CIRCUIT HAVING TRANSISTORS WITH DIFFERENT THRESHOLD VOLTAGES AND METHOD OF MANUFACTURING THE SAME

(71) Applicant: Samsung Electronics Co., Ltd., Suwon-si, Gyeonggi-do (KR)

(72) Inventors: Wei-E Wang, Austin, TX (US); Joon Goo Hong, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/348,916

(22) Filed: Nov. 10, 2016

(65) Prior Publication Data

US 2018/0076199 A1     Mar. 15, 2018

Related U.S. Application Data

(60) Provisional application No. 62/393,620, filed on Sep. 12, 2016.

(51) Int. Cl.
    *H01L 27/092*        (2006.01)
    *H01L 29/04*         (2006.01)
    (Continued)

(52) U.S. Cl.
CPC .... *H01L 29/045* (2013.01); *H01L 21/823468* (2013.01); *H01L 27/088* (2013.01); *H01L 29/4991* (2013.01); *H01L 29/6653* (2013.01); *H01L 21/82345* (2013.01); *H01L 21/823842* (2013.01); *H01L 21/823864* (2013.01); *H01L 27/092* (2013.01); *H01L 29/78* (2013.01)

(58) Field of Classification Search
CPC .......... H01L 21/7682; H01L 21/76877; H01L 21/76843; H01L 27/088; H01L 21/76802; H01L 21/823431; H01L 21/845
See application file for complete search history.

(56) References Cited

U.S. PATENT DOCUMENTS 7,741,663 B2 *   6/2010   Hause ................. H01L 29/6653
                                                                     257/288
7,812,411 B2    10/2010   Cheng
(Continued)

OTHER PUBLICATIONS

Ando T., "Ultimate Scaling of High-K Gate Dielectrics: Higher-K or Interfacial Layer Scavenging?," Materials, vol. 5, No. 12, pp. 478-500, Mar. 2012.

(Continued)

*Primary Examiner* — Marcos D. Pizarro
*Assistant Examiner* — Quinton A Brasfield
(74) *Attorney, Agent, or Firm* — Lewis Roca Rothgerber Christie LLP

(57) ABSTRACT

A complimentary metal-oxide-semiconductor (CMOS) circuit including: a substrate; and a plurality of field-effect transistors on the substrate. Each of the field-effect transistors includes: a plurality of contacts; a source connected to one of the contacts; a drain connected to another one of the contacts; a gate; and a spacer between the gate and the contacts. The spacer of one of the field-effect transistors has a larger airgap than the spacer of another one of the field-effect transistors.

16 Claims, 2 Drawing Sheets

(51) Int. Cl.

| | |
|---|---|
| H01L 29/66 | (2006.01) |
| H01L 21/8234 | (2006.01) |
| H01L 27/088 | (2006.01) |
| H01L 29/49 | (2006.01) |
| H01L 21/8238 | (2006.01) |
| H01L 29/78 | (2006.01) |

(56) References Cited

U.S. PATENT DOCUMENTS

| | | | | |
|---|---|---|---|---|
| 8,390,079 | B2* | 3/2013 | Horak | H01L 29/4983 257/401 |
| 8,409,942 | B2 | 4/2013 | Scheiper et al. | |
| 8,466,473 | B2 | 6/2013 | Cai et al. | |
| 9,362,355 | B1 | 6/2016 | Cheng et al. | |
| 9,608,065 | B1* | 3/2017 | Bergendahl | H01L 29/6656 |
| 9,735,047 | B1* | 8/2017 | Chang | H01L 21/7682 |
| 2003/0129804 | A1* | 7/2003 | Mehrotra | H01L 29/4983 438/303 |
| 2009/0039436 | A1 | 2/2009 | Doris et al. | |
| 2009/0321853 | A1* | 12/2009 | Cheng | H01L 29/42368 257/410 |
| 2013/0026575 | A1 | 1/2013 | Moroz et al. | |
| 2014/0264479 | A1* | 9/2014 | Cai | |
| 2014/0264753 | A1* | 9/2014 | Yen | H01L 28/20 257/536 |
| 2015/0091089 | A1* | 4/2015 | Niebojewski | H01L 29/0843 257/347 |
| 2015/0214362 | A1 | 7/2015 | Oh | |

OTHER PUBLICATIONS

Ando, T., et al., "Understanding mobility mechanisms in extremely scaled $HfO_2$ (EOT 0.42 nm) using remote interfacial layer scavenging technique and $V_T$-tuning dipoles with gate-first process," 2009, pp. 1-4.

Brunet, L., et al., "New insight on $V_T$ stability of HK/MG stacks with scaling in 30nm FDSOI technology," 2010, pp. 29-30.

Cartier, E. A., "(Invited) The Role of Oxygen in the Development of Hf-Base High-k/Metal Gate Stacks for CMOS Technologies," 2010, pp. 83-94.

Chau, R., et al., "High-k/Metal-Gate Stack and Its MOSFET Characteristics," IEEE Electron Device Lett., vol. 25, No. 6, pp. 408-410, Jun. 2004.

Choi, K., et al., "The effect of metal thickness, overlayer and high-k surface treatment on the effective work function of metal electrode," 2005, pp. 101-104.

Colinge, J.-P. Ed., FinFETs and other multi-gate transistors. New York, NY: Springer, 2008, 350 pages.

Guha S., et al., "Oxygen Vacancies in High Dielectric Constant Oxide-Semiconductor Films," Phys. Rev. Lett., vol. 98, No. 19, May 2007.

Hrach R., et al., "Effect of vacuum conditions on breakdown voltage between electrodes in vacuum," Czechoslov. J. Phys., vol. 30, No. 5, pp. 518-521, May 1980.

Huang, A., et al., "Interface dipole engineering in metal gate/high-k stacks," Chin. Sci. Bull. vol. 57. No. 22. pp. 2872-2878. Aug. 2012.

Kadoshima, M., et al., "Effective-Work-Function Control by Varying the TiN Thickness in Poly-Si/TiN Gate Electrodes for Scaled High- $k$ CMOSFETs," IEEE Electron Device Lett., vol. 30, No. 5, pp. 466-468, May 2009.

Kavalieros, J., et al., "Tri-Gate Transistor Architecture with High-k Gate Dielectrics, Metal Gates and Strain Engineering," 2006, pp. 50-51.

Kita, K., et al., "(Invited) Formation of Dipole Layers at Oxide Interfaces in High-k Gate Stacks," in ECS Transactions, 2010, vol. 33, pp. 463-477.

Kuriyama, R., "Molecular dynamics study on the formation of dipole layer at high-k/$SiO_2$ interfaces," Jpn. J. Appl Phys., vol. 53, No. 8S1, p. 08LB02, Aug. 2014.

Lee, C.H., et al., "Ge MOSFETs performance: Impact of Ge interface passivation," 2010, pp. 18.1.1-18.1.4.

Li, X., et al., "Self-decomposition of $SiO_2$ due to Si-chemical potential increase in $SiO_2$ between $HfO_2$ and substrate—Comprehensive understanding of $SiO_2$ —scavenging in $HfO_2$ gate stacks on Si, SiGe and SiC," 2015, p. 21.4.1-21.4.4.

Li, Z. et al., Oxygen Incorporation in TiN for Metal Gate Work Function Tuning with a Replacement Gate Integration Approach, Micoelectronic Engineering, vol. 87, No. 9, Nov. 2010, pp. 1805-1807.

Liu, M. K. et al., "Investigation of the random dopant fluctuations in 20-nm bulk mosfets and silicon-on-Insulator FinFETs by Ion implantation Monte Carlo simulation," 2013, pp. 263-266.

Magnone, P., et al., "Understanding the Potential and the Limits of Gemanium pMOSFETs for VLSI Circuits From Experimental Measurements," IEEE Trans. Very large Scale Integr. VLSI Syst., vol. 19, No. 9, pp. 1569-1582, Sep. 2011.

Nabatame, T., et al., "(Invited) Mechanism of Vfb Shift in Hf02 Gate Stack by Al Diffusion from (TaC)I-xAlx Gate Electrode," ECS Trans., vol. 45, No. 3, pp. 49-59, Apr. 2012.

Natarajan, S., et al., "A 14nm logic technology featuring $2^{nd}$-generation FinFET Transmitters, air-gapped interconnects, self-aligned double patterning and a 0.0588µm$_2$ SRAM cell size," 2014, p. 3.7.1-3.7.3.

Ragnarsson, L.-A., et al., "Zero-thickness Multi Work Function Solutions for N7 Bulk FinFETs," 2016 Symposium on VLSI Technology Digest of Technical Papers, IEEE, 2 pages.

Togo, M., et al., "A gate-side air-gap structure (GAS) to reduce the parasitic capacitance in MOSFETs," 1996, pp. 38-39.

Xiang, J., et al., "Investigation of TiAlC by Atomic Layer Deposition as N Type Work Function Metal for FinFET," ECS J. Solid State Sci. Technol., vol. 4, No. 12, pp. 7 pages, 2015.

Xing, Z., et al., Magnetic -Field Sensitivity Enhancement by Magnetoelectric Senso Arrays, IEEE Electron Device Letters, vol. 30, No. 5, May 2009, 3 pages.

Yeo, Y.-C., et al., "Effects of high-K Dielectrics on the Workfunctions of Metal and Silicon gates," 2001, pp. 49-50.

Zenkevich, A., "Effect of heat treatments on electric dipole at metal/high-k dielectric interfaces measured by in situ XPS," Microelectron. Eng., vol. 86, No. 7-9, pp. 1777-1779, Jul. 2009.

* cited by examiner

COMPLIMENTARY METAL-OXIDE-SEMICONDUCTOR CIRCUIT HAVING TRANSISTORS WITH DIFFERENT THRESHOLD VOLTAGES AND METHOD OF MANUFACTURING THE SAME

CROSS-REFERENCE TO RELATED APPLICATION

This utility patent application claims priority to and the benefit of U.S. Provisional Patent Application Ser. No. 62/393,620, filed Sep. 12, 2016 and entitled "METHOD OF FORMING MULTI-Vt FOR CMOS USING AIRGAP SPACERS," the entire content of which is incorporated herein by reference.

BACKGROUND

1. Field

Aspects of example embodiments of the present invention relate to a complimentary metal-oxide-semiconductor (CMOS) circuit including a plurality of transistors having different threshold voltages (Vt) and a method of manufacturing the same.

2. Related Art

As the size of integrated circuit devices decreases, attempts are being made to increase the density of transistors (e.g., field-effect transistors or FETs) on a substrate. In addition, attempts have been made to provide circuit devices, such as complimentary metal-oxide-semiconductor (CMOS) circuits, that include FETs having modified threshold voltages (Vt) such that various FETs of a CMOS circuit have different threshold voltages from each other. Such circuit devices may be called multi-Vt circuit devices or mVt circuit devices.

Conventional methods of manufacturing multi-Vt circuit devices include varying a thickness of a work function metal (WFM) stack in the gate of a transistor. The WFM for an n-type FET (nFET) may include a reactive WFM, such as aluminum, hafnium, titanium, etc., and the WFM for a p-type FET (pFET) may include a midgap WFM, such as tantalum nitride (TaN), titanium nitride (TiN), with or without reactive metals, etc.

It has been shown that varying the thickness of the WFM stack (e.g., increasing the thickness of certain materials or layers in the WFM stack) in a transistor modulates the effective work function (eWF) thereof, thereby modulating the Vt of the transistor. For example, increasing the thickness of a midgap WFM has been shown to increase the eWF, and increasing the thickness of a reactive WFM has been shown to decrease the eWF. However, as the node size continues to decrease (e.g., 7 nm and smaller nodes), the space available for the WFM stack in a transistor is further reduced. As such, increasing the thickness of the WFM layers to modulate the Vt becomes (or may be) impractical as the node size decreases. Further, current manufacturing processes for forming the layers of a WFM stack may not provide the requisite accuracy and repeatability for such a method of modulating Vt to be economical.

In view of the drawbacks associated with varying the thickness of the WFM stack in a transistor, other approaches to modulate the Vt of a transistor have been studied. Such other methods include adding germanium (Ge) to a silicon (Si) channel of a transistor, which has been shown to modulate the Vt of the transistor without changing the WFM stack, and high temperature annealing (e.g., direct $O_2$ annealing) of a transistor during a step of forming a replacement metal gate. However, these approaches each have various drawbacks, such as increasing interfacial defect states (of the former) and undesirably increasing resistance (of the latter), thereby rendering these approaches less desirable.

SUMMARY

The present disclosure is directed toward various embodiments of a complimentary metal-oxide-semiconductor (CMOS) circuit including a plurality of transistors having different threshold voltages (Vt) from each other and a method of manufacturing the same.

According to an embodiment of the present invention, a complimentary metal-oxide-semiconductor (CMOS) circuit include a substrate and a plurality of field-effect transistors on the substrate. Each of the field-effect transistors includes: a plurality of contacts; a source connected to one of the contacts; a drain connected to another one of the contacts; a gate; and a spacer between the gate and the contacts. The spacer of one of the field-effect transistors has a larger airgap than the spacer of another one of the field-effect transistors.

The spacer of the one of the field-effect transistors may have an overall density that is less than the spacer of the other one of the field-effect transistors.

The gate of each of the field-effect transistors may include a metal gate and a high-k dielectric material at a bottom of and around a periphery of the metal gate, and each of the metal gates may include the same material. The effective work function of the metal gate of the one of the field-effect transistors may be different from the effective work function of the metal gate of the other one of the field-effect transistors.

The spacer of the other one of the field-effect transistors may not have the airgap.

The gate of each of the field-effect transistors may include a same work function metal.

According to another embodiment of the present invention, a method of manufacturing a complimentary metal-oxide-semiconductor (CMOS) circuit includes: forming a plurality of field-effect transistors on a substrate; selectively etching a spacer of one of the field-effect transistors; and forming another spacer in the one of the field-effect transistors, the other spacer including an airgap.

The method may further include forming a continuous sealant layer on all of the field-effect transistors.

The forming of the field-effect transistors may include a replacement metal gate process.

The forming of the other spacer may include a chemical vapor deposition process, a plasma-enhanced chemical vapor deposition process, a low-pressure chemical vapor deposition process, a reduced-pressure chemical vapor deposition process, or an atomic layer deposition process.

The forming of the other spacer may further include depositing tetraethyl orthosilicate in an oxygen, ozone, or oxidizing environment.

The forming of the other spacer may further include depositing silicon nitride, silicon oxycarbonitride, or silicon-boron-carbide-nitride in a hydrogen or reducing environment.

According to another embodiment of the present invention, a method of manufacturing a complimentary metal-oxide-semiconductor (CMOS) circuit includes: forming a plurality of field-effect transistors on a substrate, each of the field-effect transistors including a plurality of contacts, a source connected to one of the contacts, a drain connected to another one of the contacts, a gate, and a spacer between the gate and the contacts; etching the spacer from only some of the field-effect transistors; and forming another spacer in the field-effect transistors from which the spacer was etched, the other spacer including an airgap.

After the etching of the spacer and before the forming of the other spacer, a first group of the field-effect transistors may include the spacer and a second group of the field-effect transistors may have an unoccupied gap between the gate and the contacts.

After the forming of the other spacer, the second group of the field-effect transistors may have a different threshold voltage than the first group of the field-effect transistors.

The forming of the field-effect transistors may include planarizing the gate.

The etching of the spacer may occur directly after the planarizing the gate.

The forming of the other spacer may include a chemical vapor deposition process, a plasma-enhanced chemical vapor deposition process, a low-pressure chemical vapor deposition process, a reduced-pressure chemical vapor deposition process, or an atomic layer deposition process.

The forming of the other spacer may further include depositing tetraethyl orthosilicate in an oxygen, ozone, and/or oxidizing environment.

The forming of the other spacer may further include depositing silicon nitride, silicon oxycarbonitride (SiOCN), or silicon-boron-carbide-nitride (SiBCN) in a hydrogen and/or reducing environment.

The forming of the field-effect transistors may include a replacement metal gate process.

The substrate may have a crystalline orientation of (100) or (110).

The substrate may be a bulk substrate or a silicon on insulator substrate.

This summary is provided to introduce a selection of features and concepts of example embodiments of the present invention that are further described below in the detailed description. This summary is not intended to identify key or essential features of the claimed subject matter nor is it intended to be used in limiting the scope of the claimed subject matter. One or more of the described features according to one or more example embodiments may be combined with one or more other described features according to one or more example embodiments to provide a workable device.

DETAILED DESCRIPTION

Figure 1:
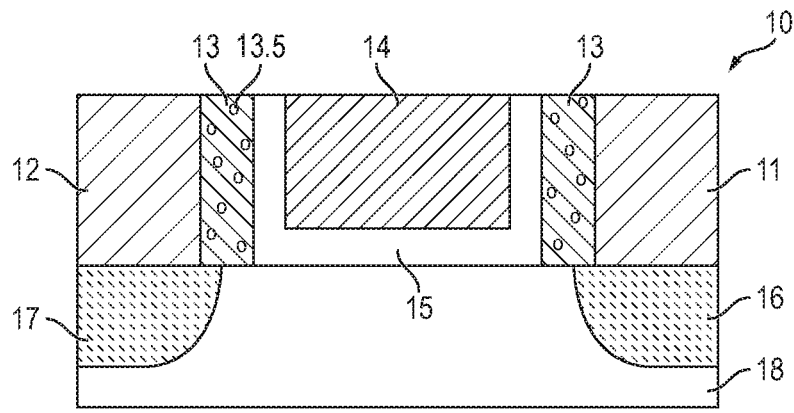
FIG. 1 shows a conventional field-effect transistor (FET)

The present invention is directed toward various example embodiments of a complimentary metal-oxide-semiconductor (CMOS) circuit including a plurality of transistors having different threshold voltages (Vt) from each other and a method of manufacturing the same. In one example embodiment, a CMOS circuit includes a substrate and a plurality of field-effect transistors on the substrate. Each of the field-effect transistors may include: a plurality of contacts; a source connected to one of the contacts; a drain connected to another one of the contacts; a gate; and a spacer between the gate and the contacts, and the spacer of one of the field-effect transistors may have a larger airgap than the spacer of another one of the field-effect transistors. Accordingly, a CMOS circuit is provided that includes transistors having different Vts from each other (e.g., a multi-Vt CMOS circuit). In other embodiments, a method of manufacturing the CMOS circuit including the transistors having different Vts from each other is provided. The CMOS circuit according to embodiments of the present invention may be used in, for example, microprocessors, memory chips or circuits, etc.

Hereinafter, example embodiments of the present invention will be described, in more detail, with reference to the accompanying drawings. The present invention, however, may be embodied in various different forms, and should not be construed as being limited to only the embodiments illustrated herein. Rather, these embodiments are provided as examples so that this disclosure will be thorough and complete and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element is referred to as being "on," "connected to," or "coupled to" another element, it can be directly on, connected to, or coupled to the other element, or one or more intervening elements may be present. In addition, it will also be understood that when an element is referred to as being "between" two elements, it can be the only element between the two elements, or one or more intervening elements may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. That is, the processes, methods, and algorithms described herein are not limited to the operations indicated and may include additional operations or may omit some operations, and the order of the operations may vary according to some embodiments. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "example" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 shows a conventional field-effect transistor (FET) 10. The FET 10 includes a first contact (or via) 11 connected to a drain 16 (e.g., a drain region) and a second contact (or via) 12 connected to a source 17 (e.g., a source region). The drain and source 16 and 17 may be doped regions of an otherwise undoped semiconductor channel 18. The undoped semiconductor channel 18 may include, for example, silicon (Si), silicon-germanium (SiGe), or any suitable group III-V semiconductor. The first and second contacts 11 and 12 may include a metal and may extend through a dielectric material to contact the drain and source 16 and 17, respectively. The first and second contacts 11 and 12 may be referred to as or may be electrically connected to the first and second electrodes 16 and 17 (e.g., the drain and source electrodes), respectively. The FET 10 further includes a spacer 13 extending around a gate (i.e., a gate region) and between the first and second contacts 11 and 12 and the gate. The spacer 13 acts as an electrical insulator to insulate the gate from the drain and source 16 and 17 and from the first and second contacts 11 and 12 and also acts as an oxygen diffusion barrier for the gate. The spacer 13 may include an oxide or nitride, such as silicon nitride (e.g., $Si_3N_4$), silicon oxide (e.g., $SiO_2$), silicon oxycarbonitride (SiOCN), or silicon-boron-carbide-nitride (SiBCN). The gate includes a work function metal gate 14 (e.g., a replacement metal gate) and a high-k dielectric material 15 (e.g., a replacement high-k dielectric material) extending around a periphery of and under the metal gate 14.

A CMOS circuit may include a plurality of such FETs 10. However, because the FETs 10 of a single CMOS circuit are generally manufactured at the same or substantially the same time (e.g., concurrently) under the same or substantially the same process conditions to increase manufacturing efficiency, each of the FETs 10 typically has the same or substantially the same threshold voltage (Vts) and each of the metal gates 14 of the FETs 10 typically has the same or substantially the same effective work function (eWF).

When a multi-Vt CMOS circuit is desired, different ones of the FETs may be separately manufactured by using different processes, such as different materials, process conditions, etc., depending on the desired Vt of each of the FETs, as discussed above. Such a manufacturing method may substantially increase production costs and reduce efficiency, and the earlier-formed FETs may be negatively affected by the processing conditions they are exposed to during the formation of the later-formed FETs.

Figure 2:
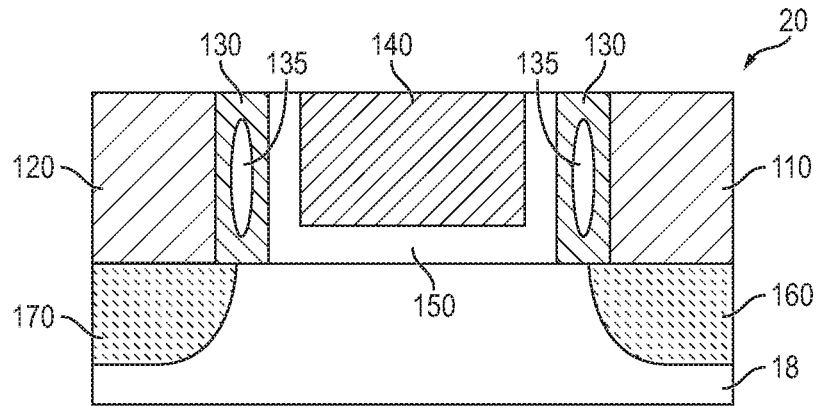
FIG. 2 shows a FET according to an example embodiment of the present invention.

FIG. 2 shows a field-effect transistor (FET) 21 according to an example embodiment of the present invention. The FET 21 includes a first contact (or via) 110 connected to a drain 160 (e.g., a drain region) and a second contact (or via) 120 connected to a source 170 (e.g., a source region). The first and second contacts 110 and 120 may include a metal and may extend through a dielectric material to be connected to the drain and source 160 and 170, respectively. The first and second contacts 110 and 120 may be referred to as or may be electrically connected to the first and second electrodes 160 and 170 (e.g., the drain and source electrodes), respectively. The FET 21 further includes a spacer 130 extending around a gate (i.e., a gate region) and between the first and second contacts 110 and 120 and the gate. The gate includes a metal gate 140 (e.g., a replacement metal gate) and a high-k dielectric material 150 (e.g., a replacement high-k dielectric material) extending around and under the metal gate 140.

The spacer 130 of the FET 21 includes an airgap 135. For example, the spacer 130 of the FET 21 may have a lower density (e.g., a lower overall density) than the spacer 13 of the FET 10, which does not have an airgap. Although the spacer 13 of the FET 10 does not have an airgap, there may be some residual (or incidental) air 13.5 dispersed throughout the spacer 13 as a byproduct of the inability to provide a perfect vacuum during manufacture. As will be further described below, the spacer 130 including the airgap 135 acts as an airgap Vt shifter or AGVS. The airgap 135 is surrounded by a thin layer of a dielectric material, such as an oxide or nitride (e.g., $SiO_2$, SiOCN, SiBCN, etc.), which forms the spacer 130. The airgap 135 reduces the parasitic capacitance of the spacer 130.

The spacer 130 including the airgap 135 may be formed by a chemical vapor deposition (CVD), a plasma-enhanced chemical vapor deposition (PE-CVD), a low-pressure chemical vapor deposition (LP-CVD), a reduced-pressure chemical vapor deposition (RP-CVD), or an atomic layer deposition (ALD) method or process.

Although the process of forming the spacer 130 may have, as a process condition, a medium vacuum, for example, in a range of μPa to mPa, a resulting vacuum inside the airgap 135 may be greater than or substantially greater than the vacuum conditions during the formation of the spacer 130. Because of the nano-size of the airgap 135, the vacuum in the airgap 135 is greater than or substantially greater than that of the overall process condition during formation of the spacer 130. Thus, an overall dielectric strength of the spacer 130 including the airgap 135 is greater than that of the spacer 13 (of FIG. 1), which does not include the airgap 135, even when the spacers 13 and 130 include (or are formed of) the same material, such as $Si_3N_4$.

In addition, the process of forming the spacer 130 (e.g., a CVD, PE-CVD, LP-CVD, RP-CVD, or ALD process) uses various suitable gases, such as silane ($SiH_4$), nitrous oxide ($N_2O$), dihydrogen ($H_2$), etc. with or without plasma assist. When the metal gate 140 is exposed to these gases, the effective work function (eWF) of the metal gate 140 (e.g., of the WFM stack of the metal gate 140) is modulated. For example, the overall process steps used to form the spacer 130 modulate oxygen and oxygen derivatives in the WFM stack of the metal gate 140, such as oxygen vacancies and dipoles at the interfaces thereof.

When an oxidation environment is present during the process of forming the spacer 130 (e.g., when tetraethyl orthosilicate (TEOS) is deposited with oxygen or ozone at a temperature in a range of approximately 300° C. to approximately 500° C. to form the spacer 130), the eWF of the metal gate 140 increases, and when a reduction environment is present during the process of forming the spacer 130 (e.g., when silicon nitride is deposited with an excess abundance of hydrogen at a temperature in a range of approximately 300° to approximately 800° C. to form the spacer 130), the eWF of the metal gate 140 decreases. Accordingly, the eWF of the metal gate 140 may be selectively increased or decreased according to the process conditions for forming the spacer 130 including the airgap 135.

FIGS. 3-6 show a method of manufacturing a CMOS circuit including a plurality of field-effect transistors according to an embodiment of the present invention.

Figure 3:
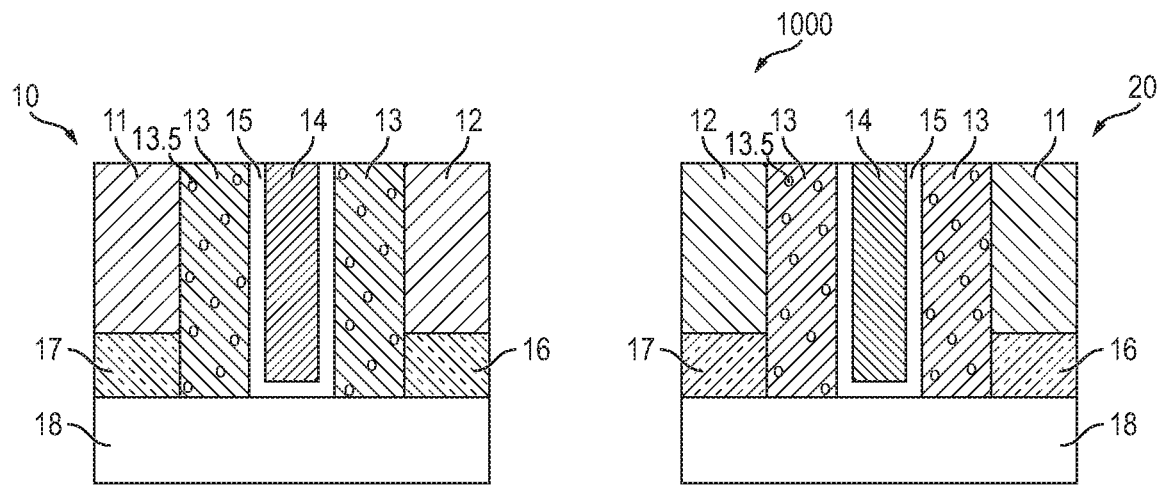
FIGS. 3-6 show a method of manufacturing a complimentary metal-oxide-semiconductor (CMOS) circuit according to an example embodiment of the present invention.

FIG. 3 is a simplified diagram of a CMOS circuit 1000 including two FETs 10 and 20, each of which is similar to the FET 10 described above with respect to FIG. 1. While the CMOS circuit 1000 is illustrated as having two FETs 10 and 20, the present invention is not limited thereto. In other embodiments, the CMOS circuit 1000 may have any suitable number of FETs. In addition, as will be discussed below, when more than two FETs are present in a CMOS circuit, the FETs may have more than two different voltage thresholds. Further, the FETs 10 and 20 may be manufactured according to any suitable method known to those skilled in the art. For example, the FETs 10 and 20 may be manufactured by utilizing a replacement metal gate process. Further, the FETs 10 and 20 may be manufactured at the same or substantially the same time as each other (e.g., may be concurrently formed or manufactured).

Figure 4:
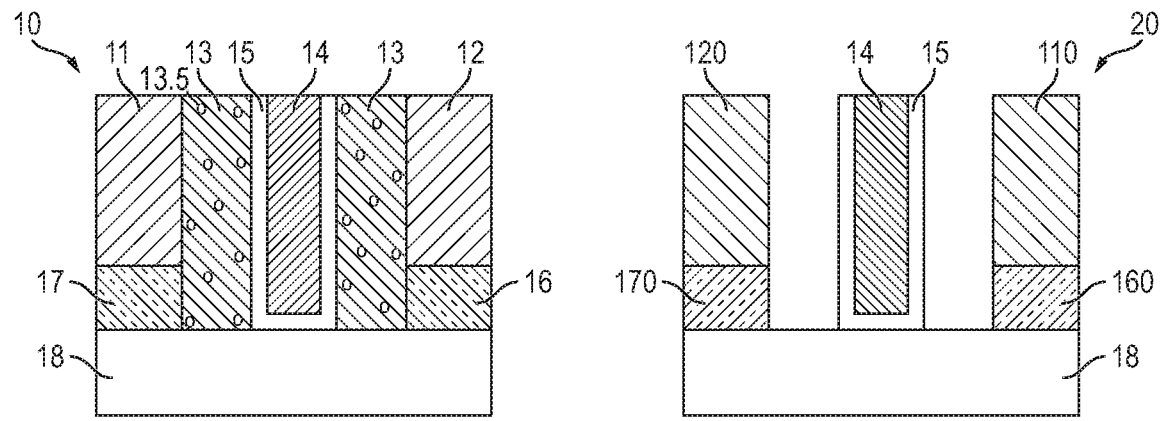

Referring to FIG. 4, one of the FETs 20 may be selected to have a modified Vt while the other one of the FETs 10 may be selected to have an unmodified Vt. Then, the FET 20 selected to have a modified Vt is processed to have the spacer 13 etched away while the other one of the FETs 10 is not processed. For example, after the metal gates 14 are deposited to form the gates (e.g., after the metal gates 14 are planarized) but before a sealant layer (see, for example, 190 in FIG. 6) is deposited over the FETs 10 and 20, the spacer 13 of the FET 20 selected to have the modified Vt may be selectively etched away.

Figure 5:
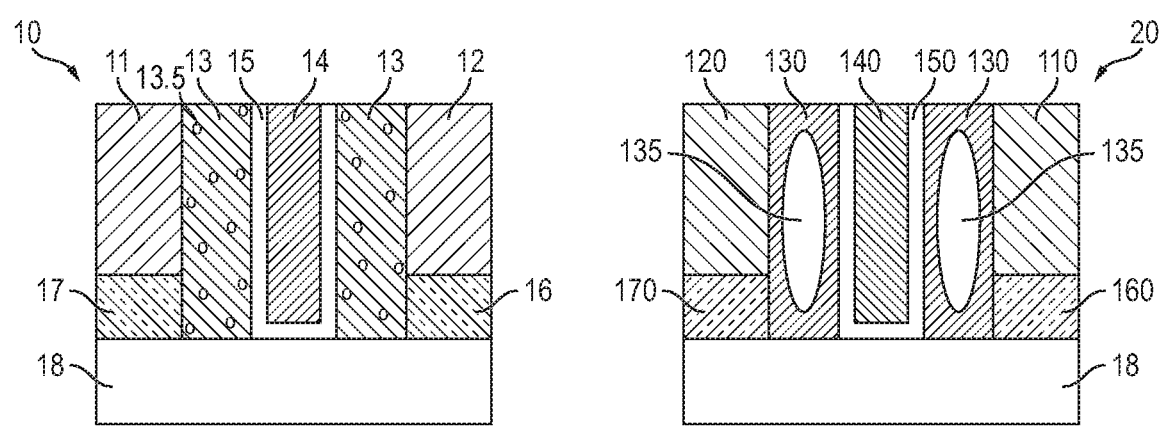

Referring to FIG. 5, a spacer 130 including an airgap 135 is formed at where the spacer 13 was originally present in the FET 20, thereby becoming a FET 21 (e.g., a Vt-shifted FET) and thereby changing the CMOS circuit 1000 to be a multi-Vt CMOS circuit 1001. As discussed above, the spacer 130 including the airgap 135 may be formed by a CVD, PE-CVD, LP-CVD, RP-CVD, or ALD process depositing, as some examples, tetraethyl orthosilicate (TEOS) or silicon nitride (e.g., $Si_3N_4$). And, as discussed above, the method of forming the spacer 130 including the airgap 135 utilizes certain gases, such as silane ($SiH_4$) gas, tetraethyl orthosilicate (TEOS), oxygen, an oxygen-containing gas, and a hydrogen gas, and the metal gate 14 is exposed to the gases during the formation of the spacer 130. When exposed to the gas, such as silane gas, tetraethyl orthosilicate (TEOS), oxygen, an oxygen-containing gas, and a hydrogen gas, the eWF of the WFM stack of the metal gate 14 changes according to the process conditions during formation of the spacer 130, thereby becoming the metal gate 140 that has a different eWF than the metal gate 14.

By utilizing an oxidation environment when forming the spacer 130, the eWF of the WFM stack of the metal gate 140 is increased. In such a case, the FET 10 that is not processed (e.g., the FET 10 that does not include the airgap or only includes the residual (or incidental) air 13.5 in the spacer 13) may be considered as an nFET having a low Vt (nLVT) while the FET 21 that is processed (e.g., the FET 21 that does include the airgap 135) may be considered as an nFET having a regular Vt (nRVT) as the Vt of the FET 21 is greater than the Vt of the FET 10. On the other hand, the FET 10 that is not processed (e.g., the FET 10 that does not include the airgap or only includes the residual (or incidental) air 13.5 in the spacer 13) may be considered as a pFET having a higher regular Vt (pRVT) while the FET 21 that is processed (e.g., the FET 21 including the airgap 135) may be considered as a pFET having a lower Vt (pLVT) as the Vt of the FET 21 is smaller than the Vt of the FET 10.

By utilizing a reduction environment when forming the spacer 130, the eWF of the WFM stack of the metal gate 140 is reduced. In such a case, the FET 10 that is not processed may be considered as an nFET having a regular Vt (nRVT) while the FET 21 that is processed may be considered as an nFET having a low Vt (nLVT) as the Vt of the FET 21 is lower than the Vt of the FET 10. On the other hand, the FET 10 that is not processed (e.g., the FET 10 that does not include the airgap or only includes the residual (or incidental) air 13.5 in the spacer 13) may be considered as a pFET having a lower regular Vt (pLVT) while the FET 21 that is processed (e.g., the FET 21 including the airgap 135) may be considered as a pFET having a higher Vt (pRVT) as the Vt of the FET 21 is larger than the Vt of the FET 10.

Figure 6:
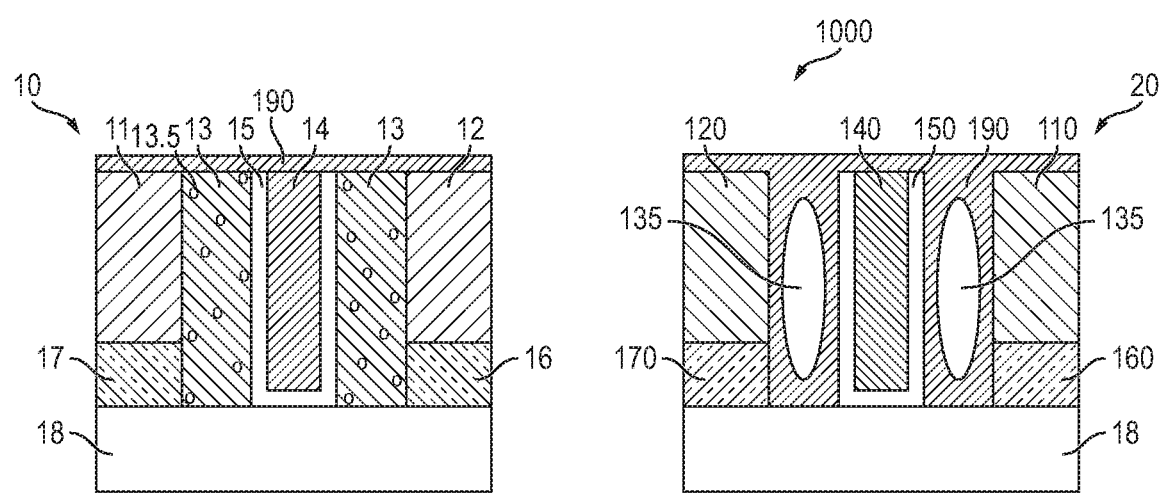

Referring to FIG. 6, after the formation of the spacer 130 including the airgap 135, the sealant layer 190 (e.g., a continuous sealant layer) is formed over all of the FETs 10 and 21 to protect the FETs 10 and 21 from an external environment. The sealant layer 190 may be formed by using a relatively low-temperature process. Further, all of the processes for forming the multi-Vt CMOS circuit 1001 after the forming of the spacer 130 may be relatively low-temperature process, thereby ensuring that any subsequent oxygen redistribution is reduced or minimized to ensure that the Vt shift obtained from the airgap spacer formation process steps is stable.

Accordingly, the multi-Vt CMOS circuit 1001 includes a plurality of FETs 10 and 21 that have different threshold voltages Vt from each other.

Although the present invention has been described with reference to the example embodiments, those skilled in the art will recognize that various changes and modifications to the described embodiments may be performed, all without departing from the spirit and scope of the present invention. Furthermore, those skilled in the various arts will recognize that the present invention described herein will suggest solutions to other tasks and adaptations for other applications. It is the applicant's intention to cover by the claims herein, all such uses of the present invention, and those changes and modifications which could be made to the example embodiments of the present invention herein chosen for the purpose of disclosure, all without departing from the spirit and scope of the present invention. Thus, the example embodiments of the present invention should be considered in all respects as illustrative and not restrictive, with the spirit and scope of the present invention being indicated by the appended claims and their equivalents.

What is claimed is:

1. A complimentary metal-oxide-semiconductor (CMOS) circuit comprising:
   a substrate; and
   a plurality of field-effect transistors on the substrate, each of the field-effect transistors comprising:
      a plurality of contacts;
      a source connected to one of the contacts;
      a drain connected to another one of the contacts;
      a gate; and
      a spacer between the gate and the contacts,
   wherein the spacer of a first one of the field-effect transistors has a larger airgap than the spacer of a second one of the field-effect transistors, and
   wherein the spacers of both the first and second field-effect transistors have a same height from a bottom surface of spacers to an upper surface thereof in a direction normal to the substrate.

2. The CMOS circuit of claim 1, wherein the spacer of the first field-effect transistor has an overall density that is less than the spacer of the second field-effect transistor.

3. The CMOS circuit of claim 1, wherein the gate of each of the field-effect transistors comprises a metal gate and a high-k dielectric material at a bottom of and around a periphery of the metal gate, each of the metal gates comprising the same material, and
   wherein the effective work function of the metal gate of the one of the field-effect transistors is different from the effective work function of the metal gate of the other one of the field-effect transistors.

4. The CMOS circuit of claim 1, wherein the spacer of the second field-effect transistor does not have the airgap.

5. The CMOS circuit of claim 4, wherein the gate of each of the field-effect transistors comprises a same work function metal.

6. A method of manufacturing a complimentary metal-oxide-semiconductor (CMOS) circuit, the method comprising:
   forming a plurality of field-effect transistors on a substrate, each of the field-effect transistors comprises a plurality of contacts, a source connected to one of the contacts, a drain connected to another one of the contacts, a gate, and a first spacer between the gate and the contacts;
   etching the first spacer from only some of the field-effect transistors; and
   forming a second spacer in the field-effect transistors from which the first spacer was etched and at where the first spacer was etched, the second spacer comprising an airgap.

7. The method of claim 6, wherein, after the etching of the first spacer and before the forming of the second spacer, a first group of the field-effect transistors comprises the first spacer and a second group of the field-effect transistors has an unoccupied gap between the gate and the contacts.

8. The method of claim 7, wherein, after the forming of the second spacer, the second group of the field-effect transistors has a different threshold voltage than the first group of the field-effect transistors.

9. The method of claim 6, wherein the forming of the field-effect transistors comprises planarizing the gate.

10. The method of claim 9, wherein the etching of the first spacer occurs directly after the planarizing the gate.

11. The method of claim 6, wherein the forming of the second spacer comprises a chemical vapor deposition process, a plasma-enhanced chemical vapor deposition process, a low-pressure chemical vapor deposition process, a reduced-pressure chemical vapor deposition process, or an atomic layer deposition process.

12. The method of claim 11, wherein the forming of the second spacer further comprises depositing tetraethyl orthosilicate in an oxygen and/or ozone environment.

13. The method of claim 11, wherein the forming of the second spacer further comprises depositing silicon nitride, silicon oxycarbonitride, or silicon-boron-carbide-nitride in a hydrogen or reducing environment.

14. The method of claim 6, wherein the forming of the field-effect transistors comprises a replacement metal gate process.

15. The method of claim 6, wherein the substrate has a crystalline orientation of (100) or (110).

16. The method of claim 6, wherein the substrate is a bulk substrate or a silicon on insulator substrate.

* * * * *